(12) United States Patent
Kondo

(10) Patent No.: US 8,808,865 B2
(45) Date of Patent: Aug. 19, 2014

(54) ADHESIVE COMPOSITION, AND ADHESIVE SHEET, SEMICONDUCTOR APPARATUS-PROTECTIVE MATERIAL AND SEMICONDUCTOR APPARATUS USING THE SAME

(71) Applicant: Shin-Etsu Chemical Co., Ltd., Tokyo (JP)

(72) Inventor: Kazunori Kondo, Takasaki (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 0 days.

(21) Appl. No.: 13/854,469

(22) Filed: Apr. 1, 2013

(65) Prior Publication Data
US 2013/0289225 A1   Oct. 31, 2013

(30) Foreign Application Priority Data

Apr. 25, 2012 (JP) ................................. 2012-100387

(51) Int. Cl.
*C08L 83/04* (2006.01)
*C08L 63/00* (2006.01)

(52) U.S. Cl.
USPC ............................ 428/447; 428/413; 525/476

(58) Field of Classification Search
None
See application file for complete search history.

(56) References Cited

U.S. PATENT DOCUMENTS

| 3,159,601 | A | 12/1964 | Ashby | |
|---|---|---|---|---|
| 3,159,662 | A | 12/1964 | Ashby | |
| 3,220,972 | A | 11/1965 | Lamoreaux | |
| 3,775,452 | A | 11/1973 | Karstedt | |
| 7,070,670 | B2 * | 7/2006 | Tomiyama et al. | 156/248 |
| 8,501,879 | B2 * | 8/2013 | Kondo et al. | 525/476 |
| 2010/0279469 | A1 * | 11/2010 | Jin | 438/113 |
| 2011/0151195 | A1 * | 6/2011 | Mitsukura et al. | 428/156 |
| 2012/0299203 | A1 * | 11/2012 | Sugo et al. | 257/792 |

FOREIGN PATENT DOCUMENTS

| JP | A-2007-217708 | 8/2007 |
|---|---|---|
| JP | A-2011-157529 | 8/2011 |

OTHER PUBLICATIONS abstract for JP 2012-195414 (Oct. 2012).*

* cited by examiner

*Primary Examiner* — Marc Zimmer
(74) *Attorney, Agent, or Firm* — Oliff PLC

(57) ABSTRACT

There is disclosed an adhesive composition comprising the following Components (A), (B) and (C), wherein a minimum melt viscosity of the composition is less than 500 Pa·s, a temperature which gives the minimum melt viscosity is less than 200° C., and, a melt viscosity at 200° C. of the composition is 500 Pa·s or more:
(A) a polymer having a reactive functional group
(B) a thermosetting resin
(C) a compound having flux activity. As a result, there is provided an adhesive composition which can be suitably used for preparation of a semiconductor apparatus, particularly an adhesive composition which difficultly causes voids between bumps at the bonding, difficultly causes positional divergence of bumps, and difficultly causes voids after completion of solder bonding.

16 Claims, 6 Drawing Sheets

FIG. 8
STEP (a) 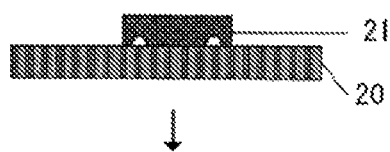
STEP (b) 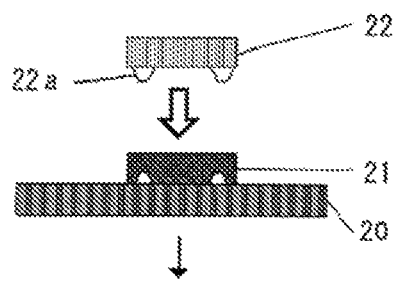
STEP (c) 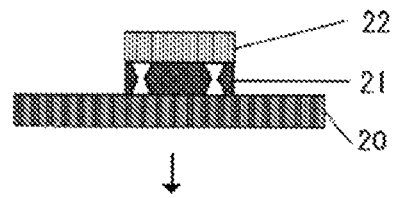
STEP (d) 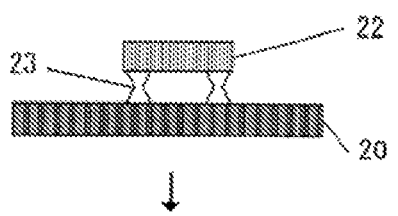
STEP (e) 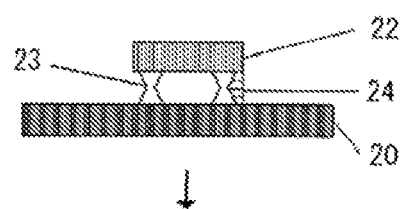
STEP (f) 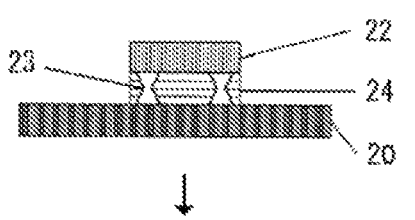
STEP (g) 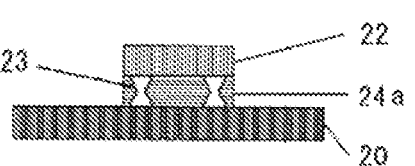

ADHESIVE COMPOSITION, AND ADHESIVE SHEET, SEMICONDUCTOR APPARATUS-PROTECTIVE MATERIAL AND SEMICONDUCTOR APPARATUS USING THE SAME

FIELD OF THE INVENTION

The present invention relates to an adhesive composition, particularly to an adhesive composition which is used suitably for preparing a semiconductor apparatus using a flip-chip mounting method. Further, the present invention relates to an adhesive sheet and a protective material for a semiconductor apparatus which have an adhesive layer made of the adhesive composition, and a semiconductor apparatus having a cured product obtained from the adhesive composition.

DESCRIPTION OF THE RELATED ART

With ongoing trends toward smaller and higher performance electronic equipments in recent years, demand of higher density and highly integration for semiconductor apparatus are getting larger, and larger capacity and higher density of an IC package are progressing. Until now, for connecting a semiconductor chip and a substrate, a wire bonding system using a thin metallic wire has widely been applied. However, to comply with the demand of high density and highly integrated semiconductor apparatus, flip-chip connection systems in which conductive protrudings called to as "bumps" are formed on semiconductor chips to directly connect the substrate electrodes and the bumps of the semiconductor chip are now becoming the main stream.

In the flip-chip connection systems, interstices between the semiconductor chip and the circuit substrate are sealed with an underfill material in order to improve the strength of the connected portion and reliability of the semiconductor apparatus. A capillary underfill method is generally applied for the sealing with an underfill material. The capillary underfill method is a method in which the underfill material is applied on the one side or plural faces of the chip to allow the underfill material to flow into interstices between a circuit substrate and a chip through a capillary phenomenon to fill there (Patent Document 1). However, in recent years, the demands of higher density and highly integrated semiconductor apparatus are becoming grater, and pitches between bumps and gaps between chips are getting narrower so that there sometimes cause the problem that air is likely involved at the time of filling the underfill material to generate voids whereby reliability is impaired.

The capillary underfill method requires the steps (a) to (g) shown in FIG. 8. The steps will be explained below.

Step (a): A flux material 21 is applied on a circuit substrate 20

Step (b): A semiconductor chip 22 provided with bumps 22*a* is mounted on the circuit substrate 20 via the flux material 21

Step (c): The semiconductor chip 22 is bonded to the circuit substrate 20 via the flux material 21 to form bonding parts 23

Step (d): The flux material 21 are washed out

Step (e): An underfill material 24 is applied on one side or plural faces of the semiconductor chip 22

Step (f): The underfill material 24 is allowed to flow into interstices between the circuit substrate 20 and the semiconductor chip 22 through capillary phenomenon Step (g): The filled underfill material (24*a*) is cured to encapsulate the semiconductor apparatus.

As described above and shown in FIG. 8, the capillary underfill method comprises complicated steps and requires treatment of the wastewater from the flux washing. Further, Step (f) relies on the capillary phenomenon, so that the time for filling the material is long, and, therefore, problems occurred sometimes in the productivity of a semiconductor apparatus.

As a method for solving these problems, it has been proposed a method in which an adhesive layer is formed on the side where bumps have been formed of a wafer having a plural number of the bumps, then, the wafer is subjected to dicing with the adhesive layer to obtain a separated semiconductor chip having the adhesive layer. The semiconductor chip having the adhesive layer separated by the dicing is electrically connected to the other semiconductor chip or a substrate by bonding via the bumps. As an adhesive composition to be used for the adhesive layer formed on such a wafer, an adhesive composition comprising a thermosetting compound, a polymer having a functional group capable of reacting with the thermosetting compound, and a heat curing agent, and a melt viscosity at a bonding temperature is 10 Pa·s or more and 15000 Pa·s or less has been disclosed (Patent Document 2).

CITATION LIST

Patent Literature

[Patent Document 1] Japanese Examined Patent Publication No. 2007-217708

[Patent Document 2] Japanese Examined Patent Publication No. 2011-157529

SUMMARY OF THE INVENTION

However, in the adhesive composition described in Patent Document 2, when occurrence of voids at the bonding is intended to be controlled, positional divergence of the bumps is generated at mounting whereby there is a problem that conduction cannot be taken. To the contrary, when the mounting is tried not to cause positional divergence of the bumps, voids have sometimes been generated between chips after bonding. Thus, the method disclosed in Patent Document 2 cannot sufficiently improve the strength of the connected portion, adhesiveness between the semiconductor chip and the circuit substrate or reliability of the semiconductor apparatus. Therefore, it is desired to develop an adhesive composition which can provide a semiconductor apparatus having no occurrence of voids at the bonding, no positional divergence of bumps, and no occurrence of voids after completion of solder bonding, and having excellent connection reliability.

The present invention has been accomplished to solve the above-mentioned problems, and an object thereof is to provide an adhesive composition which can be suitably used for the preparation of a semiconductor apparatus, in particular, to provide an adhesive composition which difficultly generates voids between bumps at the bonding, difficultly generates positional divergence of bumps, and difficultly generates voids after completion of solder bonding.

In order to solve the above-mentioned problems, the present invention is to provide an adhesive composition comprising the following mentioned Components (A), (B) and (C), wherein a minimum melt viscosity is less than 500 Pa·s, a temperature which gives the minimum melt viscosity is less than 200° C., and, a melt viscosity at 200° C. is 500 Pa·s or more.

(A) a polymer having a reactive functional group,
(B) a thermosetting resin, and
(C) a compound having flux activity.

When the above composition is used as an adhesive composition, it can be suitably used for the preparation of a semiconductor apparatus, in particular it difficultly generates voids between bumps at the bonding, difficultly generates positional divergence of bumps, and difficultly generates voids after completion of solder bonding.

In this case, the above-mentioned (A) polymer having a reactive functional group is preferably a silicone resin.

If Component (A) is a silicone resin, it is more excellent in controllability of a molecular weight of the polymer, a kind of a reactive functional group and an amount of the reactive functional group, or adhesiveness, heat resistance and insulation reliability as an adhesive composition.

Also, the reactive functional group is preferably at least one selected from a hydroxyl group and an epoxy group.

The hydroxyl group or the epoxy group can improve reactivity with a thermosetting resin which is Component (B), or storage stability as the adhesive composition, so that the reactive functional group possessed by the polymer of Component (A) is preferably at least one of these groups.

It is also preferred that the above-mentioned (B) thermosetting resin is an epoxy resin.

If Component (B) is an epoxy resin, at the time of curing the adhesive composition, the thermosetting resin of Component (B) and the polymer having a reactive functional group of Component (A) are cross-linked so that adhesiveness of an adhesive layer formed by using the adhesive composition and connection reliability of the cured product are more improved.

Further, at least one of an epoxy resin-hardener and an epoxy resin-hardening accelerator is preferably contained.

By using these components, the curing reaction can be promoted suitably and uniformly.

Moreover, the above-mentioned compound (C) having flux activity is preferably a compound having a carboxyl group or a phenolic hydroxyl group.

If Component (C) is the compound having a carboxyl group or a phenolic hydroxyl group, when the functional surface of a semiconductor chip to which the adhesive composition is adhered is solder bonded, an effect of removing a metal oxide film of the bumps existing on the functional surface by heating becomes particularly high.

The present invention further provides an adhesive sheet having the adhesive layer formed by using the adhesive composition, and a protective material of the semiconductor apparatus having an adhesive layer formed by using the adhesive composition.

Such a protective material of the semiconductor apparatus or an adhesive sheet of the present invention becomes materials having excellent adhesiveness, heat resistance and humidity resistance.

The present invention further provides a semiconductor apparatus having a cured product of the adhesive composition.

Such a semiconductor apparatus of the present invention is excellent in connection reliability or insulation reliability.

As explained above, the adhesive composition of the present invention can form an adhesive layer excellent in flexibility by containing a polymer having a reactive functional group. Also, a cross-linking structure is formed by the thermosetting reaction of the polymer having a reactive functional group and the thermosetting resin, so that it is possible to ensure heat resistance, adhesiveness and reliability necessary for the protective material of a semiconductor. Such an adhesive composition of the present invention can be suitably used as an adhesive layer for an adhesive sheet and a protective material of a semiconductor, and can provide a semiconductor apparatus ensured in connection reliability and insulation reliability.

The adhesive composition of the present invention comprises the compound having flux activity so that it forms an adhesive layer having an effect (the flux activity) of removing a metal oxide film by heating, etc. Therefore, a semiconductor apparatus excellent in connection reliability can be provided. Additionally, when the semiconductor chip and the circuit substrate are connected, the adhesive layer works as a flux, whereby a step where the flux material is applied on the circuit substrate (Step (a) in FIG. 8), a step where the flux are washed off (Step (d) in FIG. 8), a step where an underfill material is applied on one side or plural faces of the semiconductor chip (Step (e) in FIG. 8), and a step where the underfill material is allowed to flow into interstices between the circuit substrate and the chip through capillary phenomenon (Step (f) in FIG. 8) at the time of flip-chip mounting the semiconductor chip on the substrate are unnecessary, whereby the productivity of a semiconductor apparatus can be improved.

Moreover, the adhesive composition of the present invention has a temperature at which the composition becomes the minimum melt viscosity at lower than 200° C., and further the minimum melt viscosity is less than 500 Pa·s, and the melt viscosity at 200° C. is 500 Pa·s or more. Thus, even when chips are bonded to bumps, no air is involved therein, and water (vapor) formed by the reaction of the flux component and bumps or the metal oxide film existing at the surface of a metal terminal can be confined. When the bonding is carried out by using such an adhesive composition of the present invention, bonding can be carried out without voids, positional divergence of bumps difficultly occurs, and no void is generated after mounting.

BRIEF DESCRIPTION OF THE DRAWINGS

FIG. 8 is a flow diagram which shows a flip-chip mounting process in a capillary underfill method.

DETAILED DESCRIPTION OF THE PREFERRED EMBODIMENTS

Figure 1:
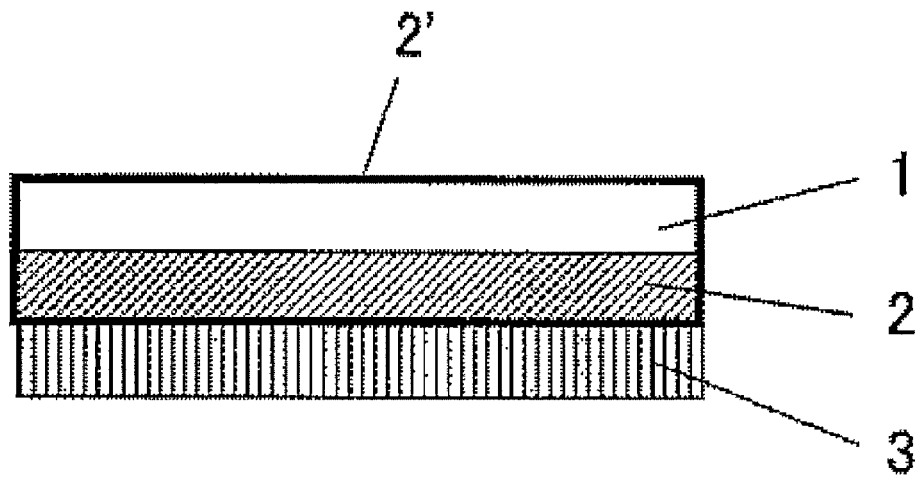
FIG. 1 shows an aspect where an adhesive sheet having an adhesive layer formed by using the adhesive composition of the present invention is pressure bonded on a semiconductor wafer.

In the following, the present invention is explained in more detail.

As mentioned above, according to the conventional adhesive compositions, the objects of improvement in the strength of the connected portion of the semiconductor chip and the circuit substrate or improvement in reliability of the semiconductor apparatus have not yet been accomplished sufficiently, so that development of an adhesive composition which can be suitably used for the preparation of a semiconductor apparatus, in particular, an adhesive composition which does not occur voids at bonding, does not occur positional divergence of bumps, and does not occur voids after completion of solder bonding, and can provide a semiconductor apparatus excellent in connection reliability has been earnestly desired.

The present inventors have intensively studied to accomplish the above-mentioned objects, and as a result, they have found that an adhesive composition comprising a polymer having a reactive functional group, a thermosetting resin and a compound having flux activity, and having a minimum melt viscosity of less than 500 Pa·s, and a temperature at which the composition becomes the minimum melt viscosity of lower than 200° C., further the melt viscosity at 200° C. of 500 Pa·s or higher is suitably used for preparing a semiconductor apparatus, in particular, voids at bonding and after bump bonding can be controlled, and positional divergence does not occur at the mounting with narrow bump pitch, whereby accomplished the present invention.

That is, the adhesive composition of the present invention comprises an adhesive composition containing the following Components (A), (B) and (C), a minimum melt viscosity is less than 500 Pa·s, a temperature at which the composition becomes the minimum melt viscosity is less than 200° C., and, the melt viscosity at 200° C. is 500 Pa·s or more.

(A) a polymer having a reactive functional group
(B) a thermosetting resin
(C) a compound having flux activity.

The present invention is explained in more detail in the following, but the present invention is not limited by these.

<Adhesive Composition>

(A) Polymer Having Reactive Functional Group

The reactive functional group of Component (A) is not particularly limited, and may be mentioned, for example, an amino group, an urethane group, an imide group, a hydroxyl group, a carboxyl group and an epoxy group. Of these, a polymer having at least one of a hydroxyl group and an epoxy group is preferred in the viewpoints of reactivity with the thermosetting resin which is Component (B) and storage stability as an adhesive composition.

The above-mentioned polymer having a reactive functional group is not particularly limited so long as it is a polymer having a reactive functional group at the terminal end(s) and/or a side chain, and there may be mentioned, for example, an acrylic resin, a polyimide resin, a phenoxy resin, a styrene resin, a polyester resin, a silicone resin and a urethane resin. Among these, a silicone resin is most desirably used in the points that a molecular weight of the polymer, a kind of the reactive functional group and an amount of the reactive functional group can be controlled, and it is excellent in adhesiveness, heat resistance and insulation reliability.

These polymers of Component (A) may be used alone, or may be used in combination of two or more kinds.

The above-mentioned (A) polymer having a reactive functional group may be mentioned, for example, a silicone resin having a reactive functional group as shown below,

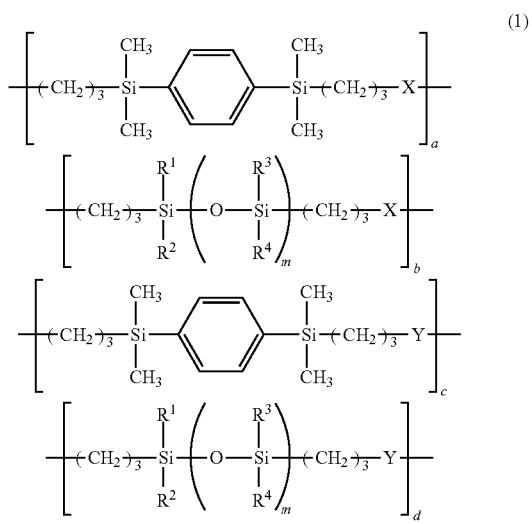

wherein $R^1$ to $R^4$ each represent a monovalent hydrocarbon group having 1 to 8 carbon atoms each of which may be the same or different from each other. Also, a repeating unit "m" represents an integer of 1 to 100, repeating units "a", "b", "c" and "d" are each 0 or a positive number, and these numbers satisfy $0<(c+d)/(a+b+c+d)\leq 1.0$. Moreover, X and Y each represent a divalent organic group represented by the following general formula (2) or (3), respectively,

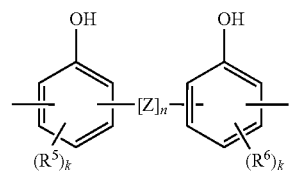

wherein, Z represents a divalent organic group selected from

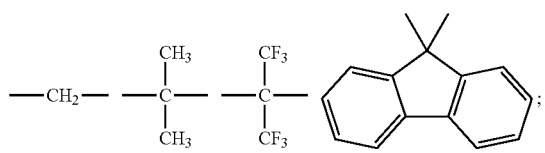

and a repeating unit "n" represents 0 or 1. $R^5$ and $R^6$ each represent an alkyl group or an alkoxy group having 1 to 4 carbon atoms, and each may be the same or different from each other. "k" represents 0, 1, or 2,

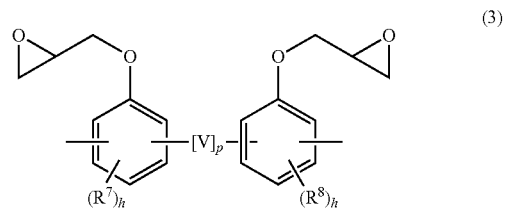

wherein V represents a divalent organic group selected from,

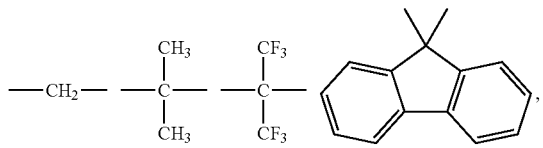

and "p" represents 0 or 1. $R^7$ and $R^8$ each represent an alkyl group or an alkoxy group having 1 to 4 carbon atoms, and each may be the same or different from each other. "h" represents 0, 1 or 2.

The silicone resin having a reactive functional group which has the recurring unit represented by the above-mentioned general formula (1) provides adhesiveness to the adhesive composition at the pressure bonding, film-forming property at the time of forming an adhesive layer and mechanical property, and excellent insulation reliability.

In the above-mentioned general formula (1), $R^1$ to $R^4$ each represent a monovalent hydrocarbon group having 1 to 8 carbon atoms, each of which may be the same or different from each other, preferably a monovalent hydrocarbon group having 1 to 6 carbon atoms. More specifically, there may be mentioned a linear, branched or cyclic alkyl group such as a methyl group, an ethyl group, a propyl group, an isopropyl group, a n-butyl group, a tert-butyl group and a cyclohexyl group; a linear, branched or cyclic alkenyl group such as a vinyl group, an allyl group, a propenyl group, a butenyl group, a hexenyl group and a cyclohexenyl group; an aryl group such as a phenyl group and a tolyl group; an aralkyl group such as a benzyl group and a phenylethyl group.

In the above-mentioned general formula (1), "m" represents an integer of 1 to 100, preferably an integer of 1 to 80.

Further, "a", "b", "c" or "d" in the above-mentioned general formula (1) is each 0 or a positive number, and these numbers satisfy $0<(c+d)/(a+b+c+d)\leq 1.0$, preferably satisfy $0.1\leq(c+d)/(a+b+c+d)\leq 0.5$ in the viewpoints of adhesiveness to the substrate, electric property and reliability, more preferably satisfy $0.15\leq(c+d)/(a+b+c+d)\leq 0.25$. In addition to the above, "c" in the above-mentioned general formula (1) preferably satisfies $0.05\leq c/(a+b+c+d)\leq 0.3$, particularly preferably satisfies $0.1\leq c/(a+b+c+d)\leq 0.15$. Moreover, "d" in the above-mentioned general formula (1) preferably satisfies $0.05\leq d/(a+b+c+d)\leq 0.3$, particularly preferably satisfies $0.2\leq d/(a+b+c+d)\leq 0.25$. Furthermore, "a" and "b" in the above-mentioned general formula (1) preferably satisfy $0.4\leq a/(a+b+c+d)\leq 0.9$ and $0.4\leq b/(a+b+c+d)\leq 0.9$.

Moreover, in the above-mentioned general formula (1), X represents a divalent organic group represented by the above-mentioned general formula (2), and Y represents a divalent organic group represented by the above-mentioned general formula (3). Z or V in the above-mentioned general formula (2) or (3) is a divalent organic group selected from:

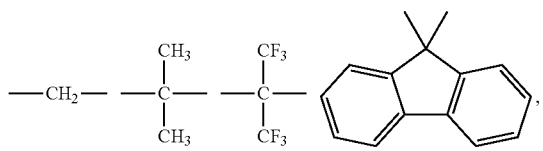

and "n" or "p" represents 0 or 1.

$R^5$ and $R^6$ in the above-mentioned general formula (2) each represent an alkyl group or an alkoxy group each having 1 to 4 carbon atoms, each of which may be the same or different from each other. Specific examples of $R^5$ and $R^6$ may include a methyl group, an ethyl group, an isopropyl group, a tert-butyl group, a methoxy group, an ethoxy group and an isopropyloxy group.

$R^7$ and $R^8$ in the above-mentioned general formula (3) is an alkyl group or an alkoxy group each having 1 to 4 carbon atoms, each of which may be the same or different from each other. Specific examples of $R^7$ and $R^8$ may include the same groups as $R^5$ and $R^6$ in the above-mentioned general formula (2).

"k" or "h" in the above-mentioned general formula (2) or (3) represents 0, 1 or 2.

The silicone resin having a reactive functional group suitable for Component (A) of the present invention preferably has a weight average molecular weight of 3,000 to 100,000, more preferably 5,000 to 80,000 in the viewpoint of adhesiveness at pressure bonding, and a film-forming property, mechanical property and melt viscosity characteristics at the time of forming an adhesive layer. The weight average molecular weight is in terms of a polystyrene measured by gel permeation chromatography (GPC).

The silicone resin having a reactive functional group represented by the above-mentioned general formula (1) can be prepared by subjecting a hydrogensilphenylene (1,4-bis(dimethylsilyl)benzene) of the following general formula (4):

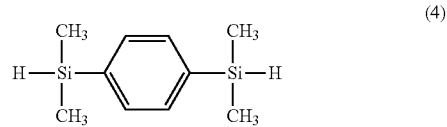

and/or a dihydroorganosiloxane of the following general formula (5):

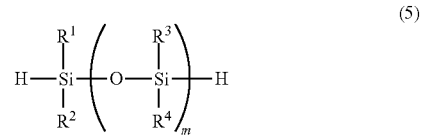

wherein $R^1$ to $R^4$, and "m" have the same meanings as defined above, with a phenol compound having a diallyl group and represented by the following general formula (6):

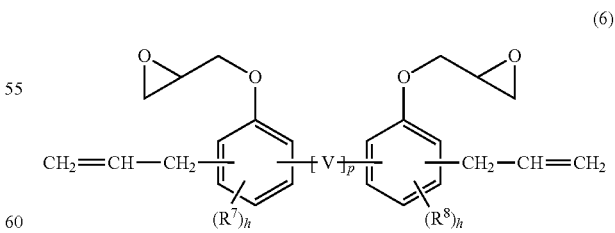

wherein V, $R^7$, $R^8$, "p" and "h" have the same meanings as defined above, and further, depending on necessity, a phenol compound having a diallyl group represented by the following general formula (7):

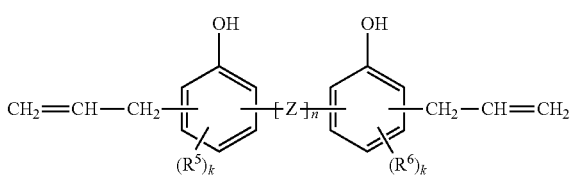

(7)

wherein Z, $R^5$, $R^6$, "n" and "k" have the same meanings as defined above,
to the so-called hydrosilylation polymerization reaction in the presence of a catalyst.

The weight average molecular weight of the silicone resin having a reactive functional group represented by the above-mentioned general formula (1) can be easily controlled by adjusting a ratio (total number of the allyl groups/total number of the hydrosilyl groups) of a total number of the allyl groups of the phenol compounds having a diallyl group represented by the above-mentioned general formula (6) and the above-mentioned general formula (7), and a total number of the hydrosilyl groups of the hydrogensilphenylene represented by the above-mentioned general formula (4) and the dihydroorganosiloxane represented by the above-mentioned general formula (5), which are subjected to the above-mentioned hydrosilylation polymerization reaction. Or else, the weight average molecular weight of the silicone resin represented by the above-mentioned general formula (1) can be easily controlled by using a molecular weight modifier, for example, a monoallyl compound such as o-allylphenol, or a monohydrosilane such as triethylhydrosilane, or a monohydrosiloxane at the time of hydrosilylation polymerization of the phenol compounds having a diallyl group represented by the above-mentioned general formula (6) and the above-mentioned general formula (7) with the hydrogensilphenylene represented by the above-mentioned general formula (4) and the dihydroorganosiloxane represented by the above-mentioned general formula (5).

The catalyst used in the above-mentioned hydrosilylation polymerization reaction may include, for example, a platinum group metal carrier such as platinum (including platinum black), rhodium and palladium; platinum chlorides, chloroplatinic acids and chloroplatinic acid salts such as $H_2PtCl_4 \cdot xH_2O$, $H_2PtCl_6 \cdot xH_2O$, $NaHPtCl_6 \cdot xH_2O$, $KHPtCl_6 \cdot xH_2O$, $Na_2PtCl_6 \cdot xH_2O$, $K_2PtCl_4 \cdot xH_2O$, $PtCl_4 \cdot xH_2O$, $PtCl_2 \cdot xH_2O$ and $Na_2HPtCl_4 \cdot xH_2O$ (wherein "x" represents preferably an integer of 0 to 6, particularly preferably 0 or 6.); alcohol-modified chloroplatinic acids (U.S. Pat. No. 3,220,972); a complex of chloroplatinic acid and an olefin (U.S. Pat. Nos. 3,159,601, 3,159,662, 3,775,452); a platinum group metal such as platinum black and palladium being carried on a carrier such as alumina, silica and carbon; rhodium-olefin complex; chlorotris(triphenylphosphine) rhodium (so-called Wilkinson's catalyst); a complex of platinum chlorides, chloroplatinic acids or chloroplatinic acid salts and a vinyl group-containing siloxane (particularly a vinyl group-containing cyclic siloxane), etc. The amount to be used is a catalytic amount, and in general, as a platinum-group metal, it is preferably 0.001% by mass to 0.1% by mass based on the total weight of the polymerization reaction product of the above-mentioned general formulae (4) to (7).

A solvent may be added in the above-mentioned hydrosilylation polymerization reaction, if necessary. The solvent may be preferably used a hydrocarbon solvent, for example, toluene and xylene.

The hydrosilylation polymerization conditions may be mentioned a polymerization temperature of preferably, e.g., 40 to 150° C., particularly preferably 60 to 120° C. in the viewpoints of not deactivating the catalyst and capable of completing the polymerization within a short period of time.

Also, a polymerization time may vary depending on a kind and amounts of the polymerization reaction product of the above-mentioned general formulae (4) to (7), and preferably about 0.5 to 100 hours, particularly within 0.5 to 30 hours to avoid migration of humidity in the polymerization reaction system. The hydrosilylation polymerization reaction is thus completed, and when a solvent is used, after removing the solvent by distillation, the silicone resin represented by the above-mentioned general formula (1) can be obtained.

(B) Thermosetting Resin

Component (B) is to be added to improve adhesiveness of the adhesive composition, and connection reliability of the cured product. In the present invention, the thermosetting resin is not particularly limited, and may include, for example, an epoxy resin, a phenol resin, a melamine resin, a urethane resin and a polyester resin. Among these, an epoxy resin is preferably used. The epoxy resin can be subjected to cross-linking reaction with a functional group (for example, a phenolic hydroxyl group and a carboxyl group) possessed by the polymer (A) having a reactive functional group. Therefore, when the thermosetting resin is an epoxy resin, the thermosetting resin and the polymer (A) having a reactive functional group are subjected to cross-linking reaction when the adhesive composition is cured so that adhesiveness of the adhesive layer and connection reliability of the cured product are more improved.

The epoxy resin may include, for example, a glycidyl ether type epoxy resin such as a bisphenol A type epoxy resin, a bisphenol F type epoxy resin, or a hydrogenated product thereof, a phenol-novolac type epoxy resin and a cresol novolac type epoxy resin; a glycidyl ester type epoxy resin such as a hexahydrophthalic acid glycidyl ester and a dimer acid glycidyl ester; and a glycidylamine series epoxy resin such as triglycidyl isocyanurate and tetraglycidyl diaminodiphenylmethane, preferably a bisphenol A type epoxy resin, a bisphenol F type epoxy resin, a phenol novolac type epoxy resin and a cresol novolac type epoxy resin. Commercially available products thereof may include, for example, in trade name, jER1001 (product of Mitsubishi Chemical Corporation), EPICLON 8305 (product of DIC CORPORATION), jER517 (product of Mitsubishi Chemical Corporation) and EOCN103S (product of NIPPON KAYAKU Co., Ltd.).

A phenol resin may be also used as the thermosetting resin. The phenol resin may include, for example, a resol type phenol resin and/or a novolac type phenol resin prepared by using phenol, or an alkylphenol such as bisphenol. A, p-t-butylphenol, octylphenol and p-cumyl-phenol; p-phenylphenol, or cresol as a starting material. The thermosetting resin may be used alone or in combination of two or more kinds.

An amount of the thermosetting resin to be added is not particularly limited, and preferably 5 to 100 parts by mass, more preferably 10 to 50 parts by mass based on 100 parts by mass of Component (A). If the amount of the thermosetting resin is within the above-mentioned range, adhesiveness is improved when the adhesive composition or the adhesive layer is pressure bonded to the substrate. It is also preferred that the cured product of the adhesive composition becomes a cured product excellent in connection reliability.

The adhesive composition of the present invention preferably further contains, in addition to the above-mentioned epoxy resin, at least one of an epoxy resin-hardener and an epoxy resin-hardening accelerator. By containing at least one of the epoxy resin-hardener and the epoxy resin-hardening accelerator, the curing reaction can proceed suitably and uniformly. When these components are formulated, an amount of the epoxy resin-hardener to be added is preferably 3 to 20 parts by mass, more preferably 5 to 10 parts by mass based on 100 parts by mass of Component (A), and an amount of the epoxy resin-hardening accelerator to be added is preferably 0.1 to 5 parts by mass, more preferably 0.3 to 3 parts by mass based on 100 parts by mass of Component (A).

The epoxy resin-hardener may be any material generally used and not particularly limited, and in the viewpoint of heat resistance, an aromatic hardener or an alicyclic hardener is more preferred. As the epoxy resin-hardener, there may be mentioned, for example, an amine hardener, an acid anhydride hardener, a boron trifluoride-amine complex salt and a phenol resin. The amine hardener may include, for example, an aliphatic amine hardener such as diethylenetriamine, triethylenetetramine and tetra-ethylenepentamine; an alicyclic amine hardener such as isophorone diamine; an aromatic amine hardener such as diaminodiphenylmethane and phenylenediamine; and dicyane-diamide. Among these, the aromatic amine hardener is preferred. The acid anhydride hardener may include, for example, phthalic anhydride, pyromellitic anhydride, trimellitic anhydride and hexahydrophthalic anhydride.

The above-mentioned epoxy resin-hardener may be used alone, or in combination of two or more kinds.

The epoxy resin-hardening accelerator may include, for example, imidazole compounds such as 2-methylimidazole, 2-ethylimidazole, 2-ethyl-4-methylimidazole, an ethyl-isocyanate compound of these compounds, 2-phenylimidazole, 2-phenyl-4-methylimidazole, 2-phenyl-4-methyl-5-hydroxy-methylimidazole, and 2-phenyl-4,5-dihydroxymethylimidazole; DBU series compounds such as 1,8-diazabicyclo(5.4.0)-undecene-7 (DBU), 1,5-diazabicyclo(4.3.0) nonene-5 (DBN), an organic acid salt of DBU, a phenol resin salt of DBU, and a tetraphenylborate of DBU derivatives; triorganophosphines such as triphenylphosphine, tributylphosphine, tris(p-methylphenyl)phosphine, tris(p-methoxyphenyl)phosphine, tris(p-ethoxyphenyl)phosphine, triphenylphosphine-triphenyl borate and tetraphenylphosphine.tetraphenyl borate; a quaternary phosphonium salt; a tertiary amine such as triethylene ammonium.triphenyl borate, etc.; and its tetraphenylboric acid salt.

The above-mentioned epoxy resin-hardening accelerator may be used alone, or in combination of two or more kinds.

(C) Compound Having Flux Activity (C) the compound having flux activity is not particularly limited so long as it has an effect of removing the metal oxide film by reducing the same (the flux activity), and may include, for example, activated rosin, an organic acid having a carboxyl group, an amine, phenol, an alcohol and azine.

In particular, the compound having flux activity in the adhesive composition of the present invention is preferably a compound having a carboxyl group or a phenolic hydroxyl group in the molecule. The compound having flux activity may be either liquid state or a solid. When the compound having flux activity is a compound having a carboxyl group or a phenolic hydroxyl group in the molecule, then it is preferred since an effect of removing the metal oxide film of the bumps existing on the functional surface by heating becomes particularly high for soldering the functional surface of the semiconductor chip to which the adhesive composition is adhered.

The compound having a carboxyl group may include, for example, an aliphatic acid anhydride, an alicyclic acid anhydride, an aromatic acid anhydride, an aliphatic carboxylic acid, and an aromatic carboxylic acid. The above-mentioned compound having a phenolic hydroxyl group may include, for example, a phenol.

The aliphatic acid anhydride may include, for example, succinic anhydride, polyadipic anhydride, polyazelaic anhydride, and polysebacic anhydride.

The alicyclic acid anhydride may include, for example, methyltetrahydrophthalic anhydride, methylhexahydrophthalic anhydride, methylhymic anhydride, hexahydrophthalic anhydride, tetrahydrophthalic anhydride, trialkyltetra-hydrophthalic anhydride and methylcyclohexenedicarboxylic anhydride.

The aromatic acid anhydride may include, for example, phthalic anhydride, trimellitic anhydride, pyromellitic anhydride, benzophenonetetracarboxylic anhydride, ethyleneglycol bistrimellitate and glycerol tristrimellitate.

The aliphatic carboxylic acid may include, for example, glutaric acid, adipic acid, pimelic acid and sebacic acid. The other aliphatic carboxylic acids may include formic acid, acetic acid, propionic acid, butyric acid, valeric acid, pivalic acid, caproic acid, caprylic acid, lauric acid, myristic acid, palmitic acid, stearic acid, acrylic acid, methacrylic acid, crotonic acid, oleic acid, fumaric acid, maleic acid, oxalic acid, malonic acid and succinic acid.

The aromatic carboxylic acid may include, for example, benzoic acid, phthalic acid, isophthalic acid, terephthalic acid, hemimellitic acid, trimellitic acid, trimesic acid, mellophanic acid, prehnitic acid, pyromellitic acid, mellitic acid, xylic acid, hemellitic acid, mesitylenic acid, prehnitylic acid, toluic acid, cinnamic acid, salicylic acid, 2,3-dihydroxybenzoic acid, 2,4-dihydroxybenzoic acid, gentisic acid (2,5-dihydroxybenzoic acid), 2,6-dihydroxybenzoic acid, 3,5-dihydroxybenzoic acid, gallic acid (3,4,5-trihydroxybenzoic acid), 1,4-dihydroxy-2-nahphthoic acid, nahphthoic acid derivatives such as 3,5-dihydroxy-2-nahphthoic acid, and diphenolic acid.

The compound having a phenolic hydroxyl group may include, for example, phenol, o-cresol, 2,6-xylenol, p-cresol, m-cresol, o-ethylphenol, 2,4-xylenol, 2,5xylenol, m-ethylphenol, 2,3-xylenol, mesitol, 3,5-xylenol, p-tertiary butylphenol, catechol, p-tertiary amylphenol, resorcinol, p-octylphenol, p-phenylphenol, bisphenol A, bisphenol F, bisphenol AF, biphenol, diallylbisphenol F, diallylbisphenol A, trisphenol, and tetrakisphenol, and a monomer containing a phenolic hydroxyl group such as phenolphthalein.

The compound (C) having flux activity is preferably capable of subjecting to cross-linking reaction with at least one of Components (A) and (B). The compound having flux activity can be incorporated into the cross-linking structure three-dimensionally by reacting with Component (A) or (B). It is particularly preferably a resin hardener having flux activity. The resin hardener having flux activity may include, for example, a compound having at least two phenolic hydroxyl groups and at least one carboxyl group directly bonded to an aromatic group. More specifically, it may include benzoic acid derivatives such as 2,3-dihydroxybenzoic acid, 2,4-dihydroxybenzoic acid, gentisic acid (2,5-dihydroxybenzoic acid), 2,6-dihydroxybenzoic acid, 3,4-dihydroxybenzoic acid and gallic acid (3,4,5-trihydroxybenzoic acid); nahphthoic acid derivatives such as 1,4-dihydroxy-2-nahphthoic acid, 3,5-dihydroxy-2-nahphthoic acid and 3,7-dihydroxy-2-nahphthoic acid; phenolphthalein; and diphenolic acid.

By incorporating the compound having flux activity into the cross-linked structure three-dimensionally, a residue of the compound having flux activity can be controlled from depositing from the three-dimensionally cross-linked structure of the cured product. According to this, growth of dendrites originated from the residue of the compound can be prevented, and insulation reliability (migration resistance) of the cured product can be more improved.

An amount of the compound having flux activity (C) is not particularly limited, and is preferably 1 to 20 parts by mass, more preferably 2 to 15 parts by mass based on 100 parts by mass of the sum of Components (A) and (B). If the amount of (C) the compound having flux activity is the above-mentioned lower limit or more, the effect of the flux activity can be sufficiently obtained, while if it is the above-mentioned upper limit or less, the compound having flux activity does not deposit from the cross-linked structure and not to cause growth of dendrites after a flip-chip mounting process. When the amount of the compound having flux activity is within the above-mentioned range, an oxide membrane on the surface of metal can be removed sufficiently, so that good bonding with high strength can be obtained in soldering.

Other Components

The adhesive composition of the present invention may contain other components than the above-mentioned Components (A) to (C), if necessary. The other components may include an inorganic filler and a silane coupling agent.

Inorganic Filler

To the adhesive composition of the present invention, an inorganic filler may be added to obtain the characteristics such as heat resistance, dimensional stability and humidity resistance. The inorganic filler may include, for example, a silicate such as talc, calcined clay, uncalcined clay, mica and glass; an oxide such as powder of titanium oxide, alumina, fused silica (fused spherical silica, fused pulverized silica) and crystalline silica; a carbonate such as calcium carbonate, magnesium carbonate and hydrotalcite; a hydroxide such as aluminum hydroxide, magnesium hydroxide and calcium hydroxide; a sulfate or a sulfite such as barium sulfate, calcium sulfate and calcium sulfite; a borate such as zinc borate, barium metaborate, aluminum borate, calcium borate and sodium borate; a nitride such as aluminum nitride, boron nitride and silicon nitride.

These inorganic fillers may be used alone, or in combination of two or more kinds. Among these, silica powder such as fused silica and crystalline silica is preferred, and fused spherical silica is particularly preferred.

By incorporating the inorganic filler in the composition, heat resistance, humidity resistance and strength after curing the adhesive composition of the present invention can be improved. Also, in the adhesive sheet in which the adhesive layer formed by using the adhesive composition of the present invention and the protective layer are laminated, a peeling property of a protective layer from an adhesive layer can be improved. A shape of the inorganic filler is not particularly limited, and is preferably a spherical shape whereby an adhesive layer having no anisotropy can be formed.

An average particle size of the inorganic filler is not particularly limited, and is preferably 0.01 μm or more and 0.5 μm or less, particularly preferably 0.01 μm or more and 0.3 μm or less. If the average particle size of the inorganic filler is the above-mentioned lower limit or more, it is preferred since the inorganic filler is difficultly aggregated and strength of the cured product is improved. While if it is the above-mentioned upper limit or less, it is preferred since transparency of the adhesive layer is improved, recognition of a mark for alignment on a surface of the semiconductor chip is easy, and alignment of the semiconductor chip and the substrate becomes easier.

The amount of the inorganic filler to be added is not particularly limited, and is preferably 5% by mass or more and 60% by mass or less, more preferably 10% by mass ore more and 50% by mass or less based on the total mass of the adhesive composition of the present invention. If the amount of the inorganic filler is the above-mentioned upper limit or less, it is preferred since transparency and tackiness of the adhesive layer are improved, and the melt viscosity is never increased.

Silane Coupling Agent

The adhesive composition of the present invention may contain a silane coupling agent. By incorporating the silane coupling agent in the composition, adhesiveness of the adhesive layer to an adherend can be further heightened. The silane coupling agent may include an epoxysilane coupling agent and an aminosilane coupling agent having an aromatic group. These may be used alone, or in combination of two or more kinds. An amount of the silane coupling agent to be added is not particularly limited, and is preferably 0.01% by mass or more and 5% by mass or less based on the total mass of the adhesive composition of the present invention.

The adhesive composition of the present invention may also contain other components than the above. For example, various additives may be optionally added to improve compatibility of (A) the polymer having a reactive functional group and (B) the thermosetting resin, or to improve storage stability or workability of the adhesive composition. Examples thereof may include an internal release agent such as a fatty acid ester, a glyceric acid ester, zinc stearate and calcium stearate; and a phenolic, phosphoric or sulfuric antioxidant.

These other optional components may be added to the adhesive composition of the present invention without any solvent, or may be dissolved or dispersed in an organic solvent to prepare a solution or a dispersion, and then, added to the composition. The solvent may be used an organic solvent as explained below for preparing a dispersion of the adhesive composition.

The adhesive composition of the present invention has a minimum melt viscosity of less than 500 Pa·s, and a temperature which gives the minimum melt viscosity is lower than 200° C., and, a melt viscosity at 200° C. is required to be 500 Pa·s or more.

When bonding is carried out by using a composition in which the minimum melt viscosity of which is less than 500 Pa·s, and a temperature which gives the minimum melt viscosity (less than 500 Pa·s) is lower than 200° C., no air is involved even when chips are bonded to a substrate having unevenness or to bumps, accordingly, bonding can be carried out without voids, and positional divergence of the chip can be prevented. On the other hand, when bonding is carried out by using a composition having the minimum melt viscosity of 500 Pa·s or more, or a composition which has the minimum melt viscosity of less than 500 but a temperature which gives the minimum melt viscosity is 200° C. or higher, air-involving at the bonding can be prevented, but positional divergence of the chip cannot be prevented.

When the melt viscosity at 200° C. is 500 Pa·s or more, water (vapor) formed by the reaction of the flux component and the bumps or a metal oxide film existing at the surface of a metal terminal can be confined so that no void is formed after mounting. On the other hand, when the melt viscosity at 200° C. is less than 500 Pa·s, forming water (vapor) cannot be confined and voids are generated at mounting.

The bonding in the present specification means a step in which the adhesive composition is formed on a semiconductor wafer or chip, and it is bonded to the other semiconductor wafer or chip, or a substrate through the adhesive composition, and a step thereafter in which the bonded material is heated to carry out connection of the bumps while controlling the load or the position. The bonding temperature in the present specification means a temperature of the step in which the wafer or chip to which the adhesive composition has been formed is bonded to the other semiconductor wafer or chip, or a substrate through the adhesive composition. The bonding temperature is made, for example, 100 to 180° C., and the bonding is desirably carried out at a temperature at which the melt viscosity of the adhesive composition becomes 10 Pa·s to 500 Pa·s.

In the present specification, the melt viscosity means a melt viscosity measured by using a melt viscometer by shearing with a circular plate of a frequency of 1 Hz while raising the temperature from 40° C. to 260° C. with a temperature raising rate of 10° C./min.

Preparation of Adhesive Composition

The adhesive composition of the present invention is prepared in a manner where (A) the polymer having a reactive functional group, (B) the thermosetting resin, (C) the compound having flux activity, and if desired, other optional components, and if necessary an organic solvent, are mixed simultaneously or separately by stirring, dissolution, mixing or dispersing. The apparatus to be used for these operations is not particularly limited, and a grinding machine equipped with a stirrer and a heater, a three-roll mill, a ball mill and a planetary mixer can be used. These apparatuses may be also used in appropriate combination. The organic solvent may be an organic solvent as a solvent for preparing a dispersion of the adhesive composition as explained below.

The adhesive composition of the present invention is preferably so adjusted that the liquid viscosity at 25° C. of 10 to 3000 mPa·s, more preferably 100 to 2000 mPa·s. The viscosity can be measured by using a rotary viscosimeter.

For forming the adhesive layer using the adhesive composition of the present invention, the adhesive composition is preferably used as a liquid by dispersing it in an organic solvent. The organic solvent may include N,N-dimethylacetamide, methyl ethyl ketone, N,N-dimethyl-formamide, cyclohexanone, cyclopentanone, N-methyl-2-pyrrolidone, toluene, methanol, ethanol, isopropanol, acetone, propylene glycol monomethyl ether and propylene glycol monomethyl ether acetate, preferably methyl ethyl ketone, cyclopentanone, propylene glycol monomethyl ether and propylene glycol monomethyl ether acetate. These organic solvents may be used alone, or in combination of two or more kinds. The organic solvent is so formulated that the solid content concentration becomes 30 to 70% by mass, preferably 40 to 65% by mass.

<Adhesive Sheet>

The present invention further provides an adhesive sheet having the adhesive layer formed by using the above-mentioned adhesive composition. Examples of the adhesive sheet include, for example, an adhesive sheet obtained by laminating an adhesive layer formed by the adhesive composition of the present invention and a protective layer (release substrate) covering the adhesive layer.

Preparation of Adhesive Sheet

An example of the preparation method of the adhesive sheet according to the present invention will be described below.

The liquid obtained by dispersing the adhesive composition in an organic solvent is applied onto the protective layer (release substrate) by using a reverse-roll coater or a comma coater. The protective layer (release substrate) onto which the dispersion of the adhesive composition had been applied is passed through an inline dryer and the organic solvent is removed to dry the layer at 80 to 160° C. for 2 to 20 minutes to form an adhesive layer to obtain an adhesive sheet having the adhesive layer. If necessary, another protective layer (release substrate) is pressure bonded onto the adhesive layer using a roll laminator to prepare an adhesive sheet. The thickness of the adhesive layer formed on the adhesive sheet is preferably 5 to 150 µm, particularly preferably 10 to 100 µm.

The protective layer (release substrate) to be used for the preparation of the adhesive sheet is not particularly limited so long as it can be released from the adhesive layer without impairing the shape of the adhesive layer. For example, there may be used plastic films such as a polyethylene (PE) film, a polypropylene (PP) film, a polymethylpentene (TPX) film, and a polyester film subjected to releasing treatment.

Use of Adhesive Sheet

The adhesive sheet having the adhesive layer formed by using the adhesive composition of the present invention can be used, for example, for the flip-chip mounting where bumps provided on a semiconductor wafer and electrodes provided on a substrate are directly connected. It can be also used for connecting semiconductor elements having through electrode to each other.

FIGS. 1 to 7 show an embodiment of mounting a semiconductor wafer using the adhesive sheet having the adhesive layer formed by using the adhesive composition of the present invention. Each Step will be explained below.

(Step 1: FIG. 1)

An adhesive sheet 2' formed by laminating a protective layer 1 and an adhesive layer 2 is bonded to a functional surface (bump-forming surface) of a semiconductor wafer 3 on which bumps 11 (FIG. 6: these are not shown in FIGS. 1 to 5) have previously been formed by, e.g., pressure bonding under heating. The pressure bonding under heating is generally carried out at a temperature of 80 to 130° C., a pressure of 0.01 to 1 MPa and a time of 5 to 300 seconds. Alternatively, it can be carried out by pressure bonding wherein the adhesive sheet is bonded under vacuum of 50 to 1300 Pa, and then, the atmosphere is returned to atmospheric pressure.

Figure 2:
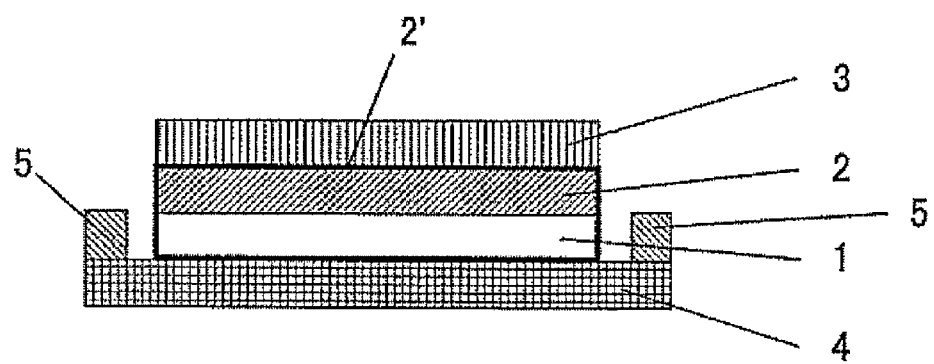
FIG. 2 shows an aspect where a semiconductor wafer is mounted on a protective tape for processing a semiconductor through an adhesive sheet having an adhesive layer formed by using the adhesive composition of the present invention.

(Step 2: FIG. 2)

The surface of the protective layer 1 side of the adhesive sheet 2' bonded onto the semiconductor wafer 3 is bonded onto a protective tape for semiconductor processing 4, and supported by a wafer ring 5. Any of the commercially available protective tape for semiconductor processing 4 may be used (for example, those commercially sold under the name of back-grind tape and dicing tape) and can be optionally selected depending on the uses. The protective tape for semiconductor processing 4 and the adhesive layer 2 can be bonded directly without via the protective layer 1. The step of bonding the adhesive sheet on the tape may be generally carried out at a temperature of 20 to 40° C., a linear pressure of 5 to 50 N/cm and a pressure time of 5 to 60 second. This step may be carried out by using an adhesive tape. It can be also carried out by pressure bonding wherein the adhesive sheet is bonded under vacuum of 50 to 1300 Pa, and then, the atmosphere is returned to atmospheric pressure.

Figure 3:
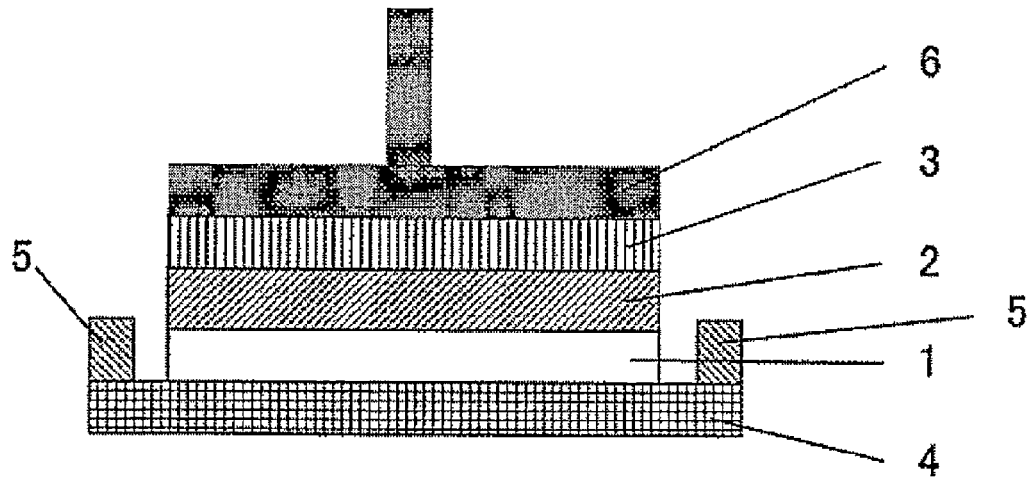
FIG. 3 shows an aspect where a semiconductor wafer is ground.

(Step 3: FIG. 3)

Subsequently, the protective tape for semiconductor processing 4 is fixed on a grinding (polishing) stage (not shown in the drawing), and the semiconductor wafer 3 is ground (polished) by a grind wheel 6. A grinding (polishing) apparatus having the grind wheel is not particularly limited, and generally used one can be used. Here, the thickness of the semiconductor wafer 7 (FIG. 4) after ground (polished) is not particularly limited, and preferably about 30 to 600 µm.

Figure 4:
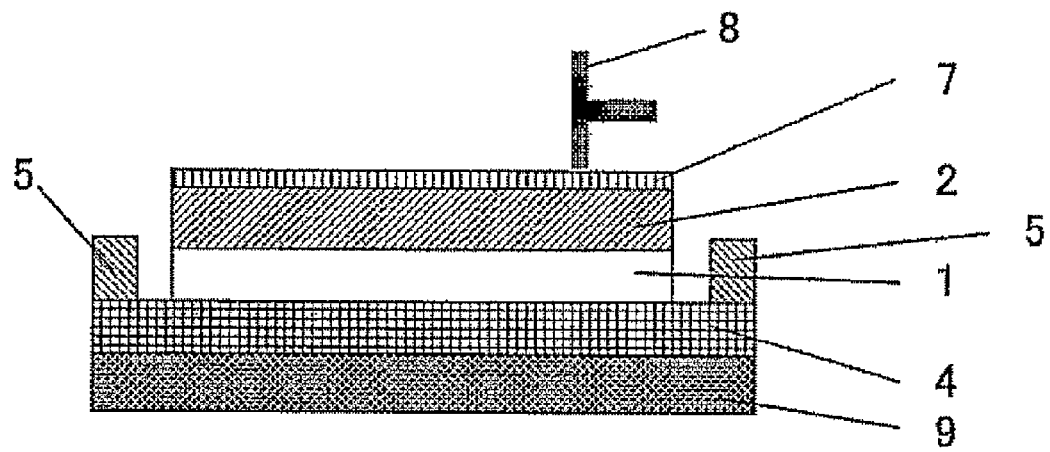
FIG. 4 shows an aspect where a semiconductor wafer is subjected to dicing.

(Step 4: FIG. 4)

Figure 5:
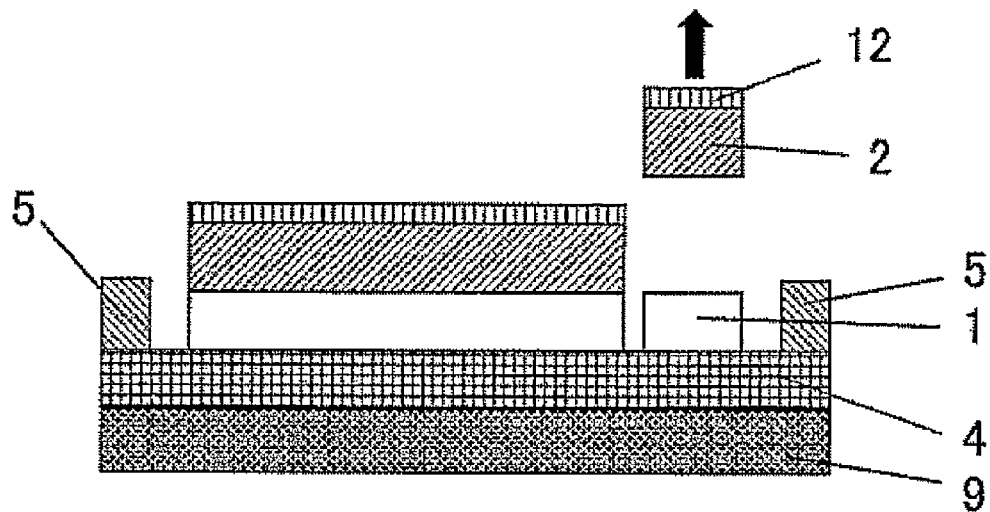
FIG. 5 shows an aspect where a cut semiconductor chip is picked up.

The semiconductor wafer 7 after ground (polished) is placed on a dicer table 9 so as to contact the surface of the protective tape for semiconductor processing 4 side and the dicer table 9. The semiconductor wafer 7 after ground (polished) is cut with the protective layer 1 and the adhesive layer 2 by using a dicing saw (not shown in the drawing) having a dicing blade 8. The spindle rotation speed and the cutting rate at the dicing may be optionally selected, and generally, the spindle rotation speed is 25,000 to 45,000 rpm, and the cutting rate is 10 to 50 mm/sec.
(Step 5: FIG. 5)

Figure 6:
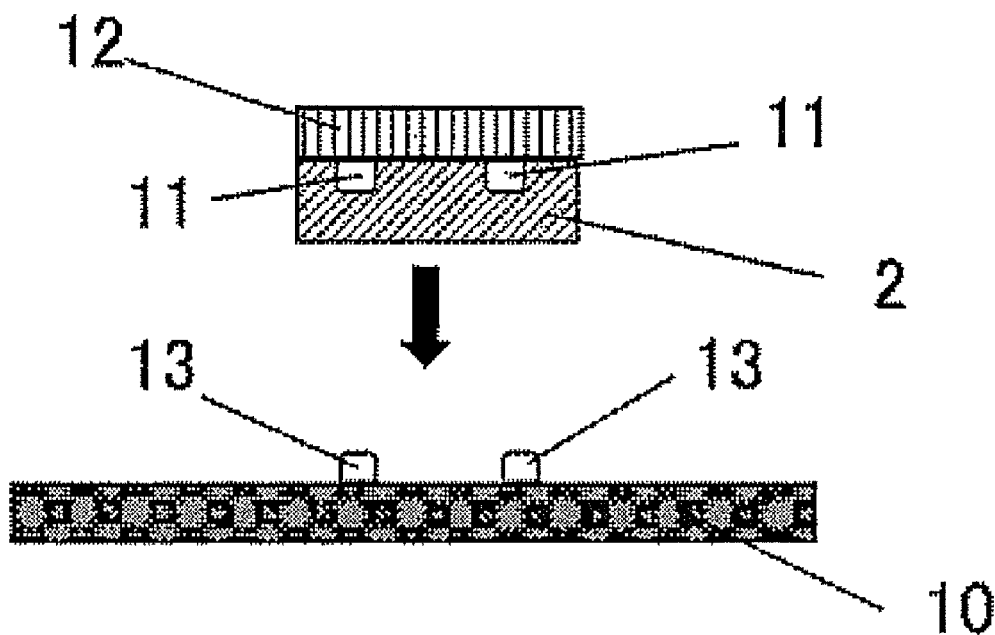
FIG. 6 shows an aspect where the semiconductor chip picked up is positioned and mounted on a base substrate.

The protective tape for semiconductor processing 4 is expanded with an expanding apparatus to make certain gaps between the semiconductor chips 12 which have been separated together with the adhesive sheet 2'. The adhesive layer 2 is peeled from the protective layer 1, and the semiconductor chip 12 having the adhesive layer is picked up.
(Step 6: FIG. 6)

Figure 7:
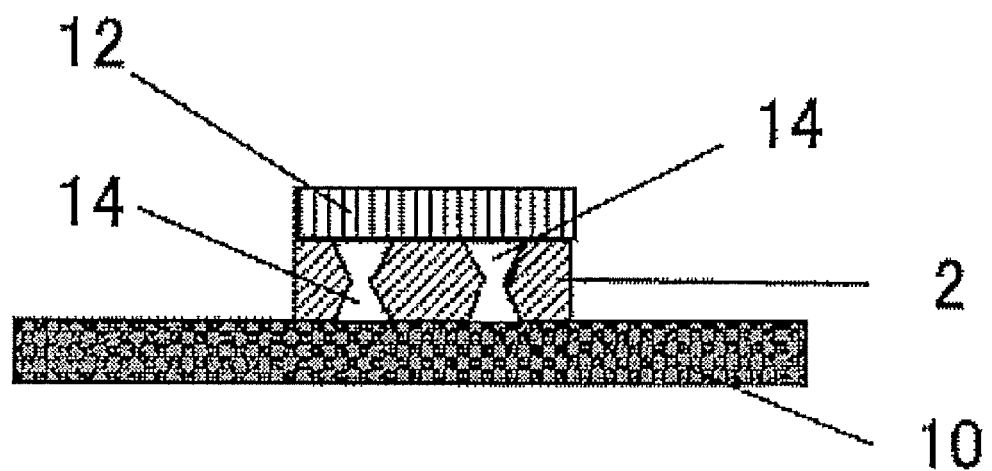
FIG. 7 shows an aspect where the semiconductor chip and the base substrate are soldered.

Bumps 11 provided on the functional surface of the cut semiconductor chip 12 is aligned with electrodes 13 on a base substrate 10 with a flip-chip bonder (not shown in the drawing), and the semiconductor chip 12 is mounted on the base substrate 10.
(Step 7: FIG. 7)

The bumps 11 provided on the functional surface of the cut semiconductor chip 12 are bonded to the electrodes 13 on the base substrate 10 with heat and pressure (bonded portion 14). The heat and pressure bonding is generally carried out at a temperature of 100 to 280° C., a load of 1 to 500 N, and a time of 1 to 30 seconds. Then, the adhesive composition is cured by heating to seal gaps between the semiconductor chip 12 and the base substrate 10. Curing of the adhesive composition is generally carried out at 160 to 240° C., particularly at 180 to 220° C. for 0.5 to 6 hours, particularly for 1 to 4 hours.

As stated above, by using the adhesive sheet having the adhesive layer formed by using the adhesive composition of the present invention, it is possible to omit the Steps (a), (d), (e) and (f) in the capillary underfill method (FIG. 8). Additionally, the adhesive layer formed by using the adhesive composition of the present invention has excellent adhesiveness to the base substrate at pressure bonding. Further, the adhesive layer after curing is excellent in connection reliability and insulation reliability.

<Protective Material of Semiconductor Apparatus>

The present invention also provides a protective material of the semiconductor apparatus having the adhesive layer formed by using the above-mentioned adhesive composition. As an embodiment for use as a protective material of the semiconductor apparatus, there may be mentioned, for example, a protective sheet in which the adhesive layer formed by using the adhesive composition of the present invention and a protective tape for processing the semiconductor are laminated. The adhesive layer surface of the protective sheet is bonded to the surface of the semiconductor apparatus to be protected, and after peeling the protective tape, the adhesive layer surface is cured to make a protective coating whereby the surface of the semiconductor apparatus can be protected. The cured product of the adhesive composition of the present invention is excellent in connection reliability and insulation reliability, so that it can suitably act as a protective coating of a semiconductor apparatus, and electronic parts such as a diode, a transistor, IC and LSI. The embodiment of use of the protective coating may be mentioned, for example, a junction coating film on the surface of a semiconductor device such as a diode, a transistor, IC and LSI, a passivation film and a buffer coating film; an a ray shielding film for LSI; an interlayer dielectric film of multilayer wiring; conformal coating of a printed circuit board; an ion implantation mask; and a surface top coat of a solar battery.

<Semiconductor Apparatus>

Moreover, the present invention provides a semiconductor apparatus having the above-mentioned cured product of the adhesive composition.

As stated above, one aspect of the preparation method of a semiconductor apparatus according to the present invention may be mentioned a method in which a semiconductor chip is mounted on a base substrate through the adhesive layer formed by using the adhesive composition of the present invention, and then, the adhesive composition is cured. Another aspect may be mentioned a method in which a protective material of the semiconductor apparatus having the adhesive layer formed by using the adhesive composition of the present invention is bonded on the protective surface of the semiconductor apparatus (adherend), and then, the adhesive composition is cured to form a protective coating. The adhesive composition of the present invention is excellent in film-forming property and adhesiveness to a substrate, and, can provide a cured product excellent in connection reliability and insulation reliability (migration resistance) under high temperature and high humidity conditions, so that it is suitably utilized for application of high density and highly integration of semiconductor apparatuses.

EXAMPLES

In the following, the present invention is explained in more detail by referring to Synthesis Example of a silicone resin as (A) the polymer having a reactive functional group in the present invention and Examples and Comparative Examples of the adhesive composition of the present invention, but the present invention is not limited by these.

Chemical formulae of Compounds (M-1) to (M-6) to be used in Synthesis Examples 1 and 2 of the silicone resins as (A) the polymer having a reactive functional group in the present invention are shown below.

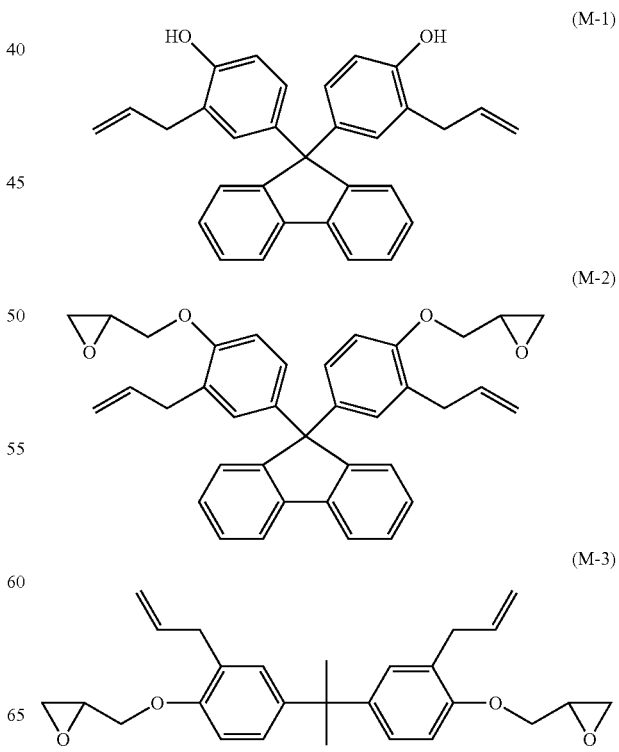

(M-4)

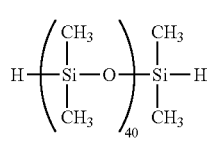

(M-5)

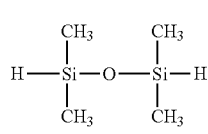

(M-6)

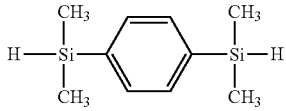

In Synthesis Examples, the weight average molecular weight of the respective polymers was determined by gel permeation chromatography (GPC) with monodispersed polystyrene as a standard under analysis conditions where a GPC column of TSK gel Super HZM-H (product of TOSOH CORPORATION), a flow rate of 0.6 ml/min, an eluting solvent of tetrahydrofuran, and a column temperature of 40° C. Also, $^1$H-NMR analysis of the respective polymers was carried out using JNM-LA300WB (product of JEOL Ltd.), with deuterochloroform as a solvent.

Synthesis Example 1

Synthesis Example 1 concerning the silicone resin as (A) the polymer having a reactive functional group in the present invention is explained. In a five-liter flask equipped with a stirrer, a thermometer, a nitrogen inflow instrument and a reflux condenser, 220.5 g of Compound (M-1) and 225.0 g of Compound (M-3) were dissolved in 1,875 g of toluene, then, 949.6 g of Compound (M-4) and 6.1 g of Compound (M-5) were added to the mixture, and the resulting mixture was heated to 60° C. Thereafter, 2.2 g of carbon carried platinum catalyst (5% by mass) was added to the mixture, after confirming that an inner reaction temperature became 65° C. to 67° C., the mixture was further heated to 90° C. and maintained for 3 hours. Then, the mixture was again cooled to 60° C., 2.2 g of carbon carried platinum catalyst (5% by mass) was further added to the mixture, and 107.3 g of Compound (M-6) was added dropwise into the flask over one hour. At this time, the temperature in the flask was raised to 80° C. After completion of the dropwise addition of Compound (M-6), the mixture was maintained at 90° C. for further 3 hours, cooled to room temperature, 1,700 g of methyl isobutyl ketone (MIBK) was added to the mixture, and this reaction mixture was filtered through a filter under pressure to remove the carbon carried platinum catalyst whereby a silicone resin solution was obtained. Further, to the obtained silicone resin solution was added 760 g of pure water, and the mixture was stirred, allowed to stand and the liquids were separated to remove the aqueous layer at the bottom layer. This liquids-separation and washing operation was repeated 6 times to remove a minute amount of the acid component in the silicone resin solution. Thereafter, the solvent in the silicone resin solution was removed by distillation under reduced pressure, and 950 g of cyclopentanone was added to the residue to obtain a silicone resin solution (A-1) having a solid component concentration of 60% by mass with cyclopentanone as a main solvent. When the molecular weight of (A) the silicone resin in the silicone resin solution was measured by GPC, it had a weight average molecular weight of 75,000 in terms of the polystyrene, and $(c+d)/(a+b+c+d)=0.50$.

Synthesis Example 2

Synthesis Example 2 concerning the silicone resin as (A) the polymer having a reactive functional group in the present invention is explained. In a five-liter flask equipped with a stirrer, a thermometer, a nitrogen inflow instrument and a reflux condenser, 352.8 g of Compound (M-1) and 116.1 g of Compound (M-2) were dissolved in 1,875 g of toluene, then, 949.6 g of Compound (M-4) and 6.1 g of Compound (M-5) were added to the mixture, and the resulting mixture was heated to 60° C. Thereafter, 2.2 g of carbon carried platinum catalyst (5% by mass) was added to the mixture, after confirming that an inner reaction temperature became 65° C. to 67° C., the mixture was further heated to 90° C. and maintained for 3 hours. Then, the mixture was again cooled to 60° C., 2.2 g of carbon carried platinum catalyst (5% by mass) was further added to the mixture, and 107.3 g of Compound (M-6) was added dropwise into the flask over one hour. At this time, the temperature in the flask was raised to 73° C. After completion of the dropwise addition, the mixture was maintained at 90° C. for further 3 hours, cooled to room temperature, 1,700 g of methyl isobutyl ketone (MIBK) was added to the mixture, and this reaction mixture was filtered through a filter under pressure to remove the carbon carried platinum catalyst whereby a silicone resin solution was obtained. Further, to the obtained silicone resin solution was added 760 g of pure water, and the mixture was stirred, allowed to stand and the liquids were separated to remove the aqueous layer at the bottom layer. This liquids-separation and washing operation was repeated 6 times to remove a minute amount of the acid component in the silicone resin solution. Thereafter, the solvent in the silicone resin solution was removed by distillation under reduced pressure, and 940 g of cyclopentanone was added to the residue to obtain a silicone resin solution (A-2) having a solid component concentration of 60% by mass with cyclopentanone as a main solvent. When the molecular weight of (A) the silicone resin in the silicone resin solution was measured by GPC, it had a weight average molecular weight of 55,000 in terms of the polystyrene, and $(c+d)/(a+b+c+d)=0.20$.

Examples 1 to 5 and Comparative Examples 1 to 4

Preparation of Adhesive Composition

With the compositions shown in Table 1, (A) the polymer having a reactive functional group (silicone resin) synthesized in the above Synthesis Examples 1 and 2, (B) the thermosetting resin, (C) the compound having flux activity, and other optional components were formulated. Further, cyclopentanone was added with an amount so that the concentration of the solid components became 50% by mass, the mixture was stirred by using a ball mill, mixed and dissolved to prepare a dispersion of an adhesive composition. The unit of the numerals showing the formulation amount in Table 1 is "parts by mass".

Each component used for preparation of the adhesive composition is shown below.

(B) Thermosetting Resin jER1001 (trade name) (product of Mitsubishi Chemical Corporation, epoxy equivalent: 450 to 500)

Further, an epoxy resin-hardener and an epoxy resin-hardening accelerator shown below were used.

Epoxy resin-hardener:
  Phenolite TD-2093 (trade name) (product of DIC CORPORATION, OH equivalent: 104)
Epoxy resin-hardening accelerator:
  Curezol 2MZA-PW (trade name) (product of Shikoku Chemical Corporation, 2,4-diamino-6-[2'-methylimidazolyl-(1')]-ethyl-s-triazine)
  Curezol 2P4MZ (trade name) (product of Shikoku Chemical Corporation, 2-phenyl-4-methylimidazole)
(C) Compound Having Flux Activity
  Sebacic acid (product of Wako Pure Chemical Industries, Ltd.)
Other Optional Component
  Inorganic filler: silica (SE1050, product of Admatechs Co., Ltd., average particle size: 0.25 μm)
Preparation of Adhesive Sheet The dispersion of the adhesive composition was so coated by an applicator on the surface of the polyester film (protective layer, product of TOYOBO CO., LTD.) which had been subjected to the release treatment that the thickness after drying became 25 μm, and dried in a ventilation oven at 130° C. for 5 minutes to prepare an adhesive layer, whereby the adhesive sheet having an adhesive layer was prepared. Characteristics of the respective adhesive sheet were evaluated by the evaluation methods mentioned below. The results are shown in Table 1.

Evaluation 1: Measurement of Melt Viscosity of Adhesive Layer

The respective adhesive sheets (adhesive layer thickness: 25 μm) were laminated by a roll laminator which can control the temperature until the adhesive layer thickness became 500 μm.

The melt viscosity of the obtained adhesive sheet was measured by using a melt viscometer (MARS, product of HAAKE Corp.) by shearing with a circular plate of a frequency of 1 Hz while raising the temperature from 40° C. to 260° C. with a temperature raising rate of 10° C./min, whereby the temperature which gives the minimum melt viscosity, the minimum melt viscosity and the melt viscosity at 200° C. were obtained, respectively. The obtained results are shown in Table 1.

Evaluation 2: Presence or Absence of Voids after Semiconductor Package Mounting (SAT and Optical Microscope)

In accordance with the above-mentioned preparation method of the adhesive sheet, an adhesive sheet having an adhesive layer with a thickness of 40 μm was prepared. A bump-bearing surface of a semiconductor wafer (8 inches, thickness: 725 μm) having bumps was bonded to the adhesive layer side of each adhesive sheet using a vacuum film-laminator (temperature: 110° C., pressure: 80 Pa) (FIG. 1). Subsequently, the protective layer side of the semiconductor wafer having the adhesive sheet was bonded on a back-grind tape (product of DENKA) supported by a wafer ring at a linear pressure of about 10 N/cm and room temperature.

Then, the semiconductor wafer was cut into a size of 5 mm×6 mm square (FIG. 4, provided that the semiconductor wafer is not a material polished to a thin state) using a dicing saw equipped with a dicing blade, the separated semiconductor chip was picked up (FIG. 5) to obtain a semiconductor chip (Sn—Ag bump with a bump height of 15 μm was formed on Cu with a bump diameter of 25 μm and a bump height of 10 μm to make a total height of 25 μm, bump pitch: 50 μm, bump number: 2,200) having an adhesive layer (which correspond to 2, 11 and 12 of FIG. 6). The spindle rotation speed at the dicing was 30,000 rpm, and the cutting rate was 25 mm/sec.

Next, a semiconductor wafer (8 inches, thickness: 725 μm, bump diameter: 25 μm, Cu bump height: 10 μm, bump pitch: 50 μm, bump number: 2,200) on which the bumps have been so provided as to correspond to the above-mentioned chips was cut into a size of 11 mm×11 mm square using a dicing saw equipped with a dicing blade to obtain the separated semiconductor substrate (which correspond to 10 and 13 of FIG. 6). The spindle rotation speed at the dicing was 30,000 rpm, and the cutting rate was 25 mm/sec.

Subsequently, the semiconductor chip (which correspond to 2, 11 and 12 of FIG. 6) having the above-mentioned adhesive layer was aligned to the separated semiconductor substrate (which correspond to 10 and 13 of FIG. 6) by using a flip-chip bonder, and after mounting it at the bonding temperature shown in Table 1 for 10 sec and 50 N, subjected to heat and pressure bonding at 255° C. for 15 seconds while keeping the load of 10 N to prepare semiconductor packages with each 10 packages (FIG. 7). Subsequently, each package was heated at 180° C. for one hour to cure the adhesive layer.

With regard to the thus obtained semiconductor packages, presence or absence of voids was confirmed by using a Scanning Acoustic Tomograph (SAT) (FS300 III, product of Hitachi Engineering and Service Co., Ltd.), and evaluation of voids was carried out. When no void is confirmed, it is evaluated as "Good", and voids are confirmed as "Bad". The results are shown in Table 1. "Good" was judged as a pass.

The resulting semiconductor package was ground from the semiconductor chip side and horizontally to the chip until the chip was disappeared, and the presence of voids were observed by an optical microscope. The case where no void having a size of 25 μm or larger was confirmed was judged as "Good", and the case where voids having a size larger than 25 μm was confirmed was judged as "Bad" to evaluate the void. The results are as shown in Table 1. "Good" was judged as a pass.

Evaluation 3: Chip Divergence after Mounting Semiconductor Package (X Ray and Optical Microscope)

With regard to each of ten semiconductor packages obtained by the same method as in Evaluation 2, occurrence of chip divergence was confirmed by a three dimensional measurement X ray CT device (TDM1000-IS, product of Yamato Scientific Co., Ltd.). The case where the maximum divergence amount of the semiconductor chip and the bumps possessed by the semiconductor substrate to the horizontal direction was less than 5 μm was judged as "Good", the case where it was 5 μm or more and less than 10 μm was judged as "Fair", and the case where it was 10 μm or more was judged as "Bad", to evaluate the chip divergence. The results are shown in Table 1. "Good" was judged as a pass. Moreover, with regard to the semiconductor package finished the X ray observation, a sectional surface perpendicular to the semiconductor chip and the semiconductor substrate was ground, and both of the bumps at the up and down were confirmed to be connected or not by an optical microscope. The case where both of the bumps at the up and down were connected was judged as "Good", and not connected was judged as "Bad". The results are as shown in Table 1. "Good" was judged as good.

Evaluation 4: Adhesion Strength of Adhesive Layer

Each adhesive sheet (adhesive layer thickness: 25 μm) was bonded on a 6-inch semiconductor wafer (thickness: 625 μm, product of Shin-Etsu Semiconductor) using a vacuum film laminator (temperature: 110° C., pressure: 80 Pa, TEAM-100, product of Takatori Corporation) (FIG. 1). Subsequently, the polyester film surface of the adhesive sheet was bonded on a dicing tape (product of DENKA) supported by a wafer ring at a linear pressure of about 10 N/cm and room temperature (FIG. 2). The semiconductor wafer and the adhesive sheet were cut into a size of 2 mm×2 mm square by using a dicing saw (DAD685, product of DISCO CORPORATION) equipped with a dicing blade (FIG. 4). The adhesive layer was peeled off from the polyester film and the separated semiconductor chip was picked up to obtain a semiconductor chip having an adhesive layer (FIG. 5). The spindle rotation speed at the dicing was 30,000 rpm, and the cutting rate was 25 mm/sec. The above-mentioned separated semiconductor chip was bonded on a silicon wafer (base substrate) having a size of 15 mm×15 mm square via the adhesive layer at the temperature which became the minimum melt viscosity and a load of 50 mN. Then, the adhesive composition was cured at 180° C. for one hour to obtain test pieces. The test pieces were each five pieces prepared and applied to the following adhesion strength measurement test.

Figure 9:
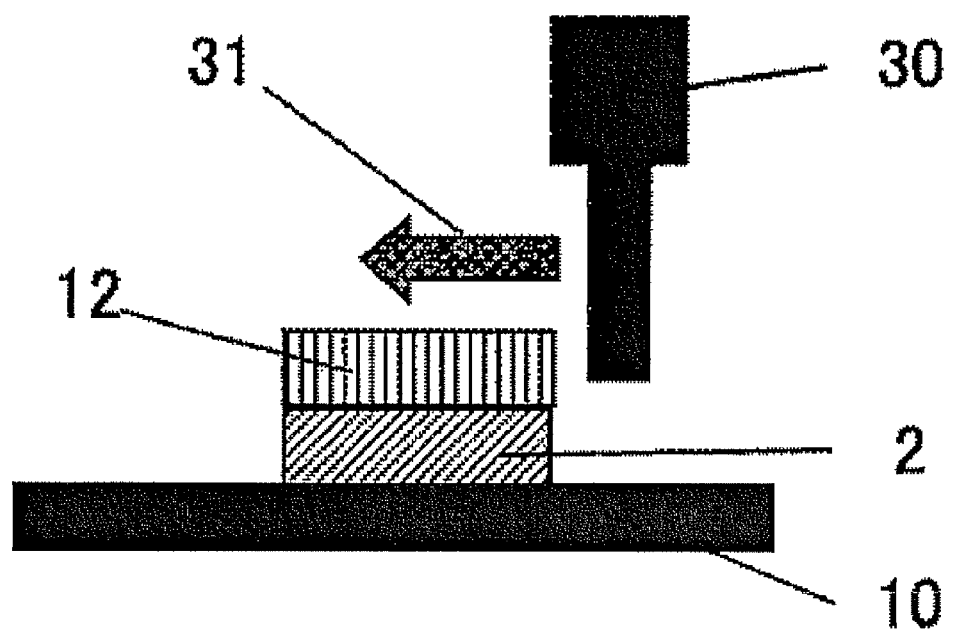
FIG. 9 shows a test to determine adhesiveness of an adhesive layer to the substrate.

The semiconductor chip (2 mm×2 mm) was peeled off from the base substrate (silicon wafer of 15 mm×15 mm square) using a bond tester (Dage series 4000-PXY: product of Dage Co., Ltd.) to measure resistance against the peeling to evaluate the adhesion strength of the adhesive layer. The test was carried out under the conditions of a test speed of 200 µm/sec and a test height of 50 µm. The implementation drawing of the adhesion strength measurement test is shown in FIG. 9. In FIG. 9, the direction of movement of the measurement tool (Reference numeral 30) of the bond tester is shown by an arrow (Reference numeral 31). The results are as shown in Table 1. The value shown in Table 1 is an average of the values of the five test pieces, and a larger value means a larger adhesion strength of the adhesive sheet.

Evaluation 5: Connection Reliability

In accordance with the above-mentioned preparation method of the adhesive sheet, an adhesive sheet having an adhesive layer with a thickness of 65 µm was prepared. A bump-bearing surface of a semiconductor wafer (8 inches, thickness: 725 µm) having bumps was bonded to the adhesive layer side of each adhesive sheet using a vacuum film-laminator (temperature: 110° C., pressure: 80 Pa) (FIG. 1). Subsequently, the protective layer side of the semiconductor wafer having the adhesive sheet was bonded on a back-grind tape (product of DENKA) supported by a wafer ring at a linear pressure of about 10 N/cm and room temperature (FIG. 2), and the semiconductor wafer was ground (polished) to become a thickness of the semiconductor wafer of 100 µm by using a grinding (polishing) device (DAG810, product of DISCO CORPORATION) (FIG. 3).

Next, the semiconductor wafer was cut into a size of 10 mm×10 mm square (FIG. 4) using a dicing saw equipped with a dicing blade, the separated semiconductor chip was picked up (FIG. 5) to obtain a semiconductor chip (diameter: 80 µm, Sn-3Ag-0.5Cu bump, bump height: 50 µm, pitch: 150 µm, bump number: 3,844) having an adhesive layer. The spindle rotation speed at the dicing was 40,000 rpm, and the cutting rate was 25 mm/sec.

The semiconductor chip provided with the above-mentioned adhesive layer was aligned and placed on a bismaleimide-triazine (BT) resin substrate (thickness: 0.94 mm) which had been coated with a solder resist (PSR4000 AUS703, product of TAIYO INK MFG. CO., LTD.) by using a flip-chip bonder, and after mounting it at the bonding temperature shown in Table 1 for 10 sec and 60 N (FIG. 6), subjected to heat and pressure bonding at 255° C. for 15 seconds while keeping the load of 10 N to prepare flip-chip packages (each 10 packages). Subsequently, each package was heated at 180° C. for one hour to cure the adhesive layer.

Incidentally, this BT resin substrate is wired by copper so that it becomes a daisy chain with a metal wiring in the semiconductor chip when the semiconductor chip is electrically connected, and conduction (connection resistance) of the resulting semiconductor package can be confirmed.

Connection resistance of each of ten semiconductor packages prepared by the above-mentioned method was measured whereby conduction at the initial stage was confirmed. Subsequently, each package was applied to a heat cycle test (repeated 1000 cycles between a state at −25° C. for 10 minutes and a state at 125° C. for 10 minutes), and conduction after the heat cycle test was confirmed. The package which showed the conduction in both tests was judged as "Good", the package which had the conduction at the initial stage, but did not have the conduction after the heat cycle test was judged as "Fair", and the package which did not have the conduction at the initial stage was judged as "Bad", to evaluate the connection reliability. The results are as shown in Table 1. "Good" was judged as a pass.

Evaluation 6: Insulation Reliability (Migration Resistance)

A comb shaped circuit with a thickness of Cu of 5 µm, and line width/space width of 20 µm/20 µm was formed on a glass substrate, and the adhesive layer side of the adhesive sheet was bonded so that it covers the comb shaped circuit by a vacuum film laminator (temperature: 110° C., pressure: 80 Pa) (the terminals were masked with a masking tape). Then, the protective layer of the adhesive sheet was peeled off and the adhesive layer was cured by heating at 180° C. for one hour to prepare samples for evaluating insulation reliability (5 samples, respectively). A direct current of 10V was applied to the both poles of the circuit of each test piece under the conditions of a temperature of 85° C. and a relative humidity of 85% to evaluate the insulation reliability using a migration tester (MIG-86, product of IMV Corporation). After applying the voltage, the case where short circuit (decrease in resistance) took place within 1,000 hours or the case where growth of dendrites was recognized was evaluated to as bad and shown as "Bad", and the case where the resistance was maintained after 1,000 hours and no dendrite took place was evaluated to as good and shown as "Good". The results are as shown in Table 1.

TABLE 1

| Component | | Examples | | | | | Comparative Examples | | | |
|---|---|---|---|---|---|---|---|---|---|---|
| | | 1 | 2 | 3 | 4 | 5 | 1 | 2 | 3 | 4 |
| Polymer (A) having reactive functional group | (A-2) | 100 | 100 | 100 | | 100 | 100 | 100 | 100 | 100 |
| | (A-1) | | | | 100 | | | | | |
| Thermosetting resin (B) | jER1001 | 20 | 20 | 20 | 10 | 20 | 20 | 20 | 20 | 20 |
| Epoxy resin hardener | Phenolite TD-2093 | | | | 5 | | | | | |

TABLE 1-continued

| Component | | Examples | | | | | Comparative Examples | | | |
|---|---|---|---|---|---|---|---|---|---|---|
| | | 1 | 2 | 3 | 4 | 5 | 1 | 2 | 3 | 4 |
| Epoxy resin-hardening accelerator | Curezol 2MZA-PW | 0.5 | 0.5 | 0.5 | 1.0 | 0.5 | 0.1 | 0.5 | | 0.05 |
| | Curezol 2P4MZ | | | | | | | | 1.0 | |
| (C) Flux active substance | Sebacic acid | 10 | 10 | 10 | 10 | 10 | 10 | 10 | 10 | 10 |
| Inorganic filler | SE1050 | | | | | 40 | | | | |
| Temperature [° C.] which becomes minimum melt viscosity | | 150 | 150 | 150 | 140 | 150 | 185 | 150 | 120 | 210 |
| Minimum melt viscosity [Pa·s] | | 101 | 101 | 101 | 245 | 450 | 29 | 750 | 760 | 13 |
| Melt viscosity at 200° C. [Pa·s] | | 580 | 580 | 580 | 80740 | 980 | 34 | 2300 | 238400 | 20 |
| Bonding temperature [° C.] | | 150 | 135 | 120 | 140 | 150 | 150 | 150 | 120 | 150 |
| Melt viscosity at bonding temperature [Pa·s] | | 101 | 170 | 390 | 245 | 450 | 60 | 750 | 760 | 55 |
| Presence or absence of voids after semiconductor package mounting | SAT | all Good | all Good | all Good | all Good | all Good | all Bad | all Good | all Good | all Bad |
| | Optical microscope | all Good | all Good | all Good | all Good | all Good | all Bad | all Good | all Good | all Bad |
| Chip divergence after mounting semiconductor package | X ray | all Good | all Good | all Good | all Good | all Good | all Good | all Bad | all Bad | all Bad |
| | Optical microscope | all Good | all Good | all Good | all Good | all Good | all Good | all Bad | all Bad | all Bad |
| Adhesion strength [MPa] | | 28.8 | 28.8 | 28.8 | 29.3 | 26.0 | 23.0 | 20.5 | 22.5 | 21.0 |
| Connection reliability | | all Good | all Good | all Good | all Good | all Good | all Fair | all Good | all Good | all Fair |
| Insulation reliability | | all Good | all Good | all Good | all Good | all Good | all Good | all Good | all Good | all Good |

The evaluation of the presence or absence of voids after mounting the semiconductor packages was "Good" in all of ten packages of Examples 1 to 5 and Comparative Examples 2 and 3. The evaluation of the presence or absence of voids after mounting the semiconductor packages was "Bad" in all of ten packages of Comparative Examples 1 and 4.

The evaluation of the chip divergence after mounting the semiconductor packages was "Good" in all of ten packages of Examples 1 to 5 and Comparative Example 1. The evaluation of the chip divergence after mounting the semiconductor packages was "Bad" in all of ten packages of Comparative Examples 2 to 4.

The connection reliability was evaluated to as "Good" in all of ten packages of Examples 1 to 5 and Comparative Examples 2 and 3. The connection reliability was evaluated to as "Fair" in all of ten packages of Comparative Examples 1 and 4.

The insulation reliability was evaluated to as "Good" in all of five packages of Examples 1 to 5 and Comparative Examples 1 to 4.

From Table 1, Comparative Example 1 which did not satisfy the melt viscosity at 200° C. of 500 Pa·s or more required in the present invention generated voids after mounting the semiconductor package. The adhesive composition of Comparative Example 1 had a gel time measured in accordance with JIS C2161 B of 90 seconds at 150° C. which is a bonding temperature, a gel time at 240° C. of 10 seconds, and the melt viscosity at the bonding temperature of 60 Pa·s, so that it is an adhesive composition satisfying the requirements described in JP 2011-157529A, but occurrence of voids was confirmed. Also, in Comparative Example 1, due to the effect of voids after mounting, the connection reliability was also confirmed to be a failure.

The adhesive compositions of Comparative Examples 2 and 3 did not satisfy the minimum melt viscosity of less than 500 Pa·s required in the present invention, so that it was confirmed that it causes chip divergence after mounting the semiconductor package.

Comparative Examples 4 did not satisfy the melt viscosity at 200° C. of 500 Pa·s or more required in the present invention, occurrence of voids was observed after mounting the semiconductor package, and due to the effect of voids after mounting, the connection reliability was also confirmed to be bad. Further, Comparative Examples 4 did not satisfy the temperature which gave the minimum melt viscosity of lower than 200° C. required in the present invention, so that it was confirmed to cause chip divergence after mounting the semiconductor package.

To the contrary, the adhesive layer formed by using the adhesive composition of the present invention did not cause voids after mounting, and no chip divergence was also confirmed. Also, it was excellent in adhesion strength as well as connection reliability and insulation reliability. In addition, the semiconductor apparatus protected by the adhesive layer of the present invention became a semiconductor apparatus ensured in connection reliability and insulation reliability.

The adhesive composition of the present invention can provide a cured product showing no occurrence of void and chip divergence after mounting the semiconductor package, excellent in adhesiveness to the substrate, and excellent in connection reliability and insulation reliability (migration resistance) under high temperature and high humidity conditions. Therefore, the adhesive composition of the present invention can be expected to be suitably utilized for the application of high density and highly integrated semiconductor apparatus.

It must be stated here that the present invention is not restricted to the embodiments shown by Examples. The embodiments shown by Examples are merely examples so that any embodiments composed of substantially the same technical concept as disclosed in the claims of the present invention and expressing a similar effect are included in the technical scope of the present invention.

What is claimed is:

1. An adhesive composition comprising components (A), (B) and (C) mentioned below, wherein a minimum melt viscosity of the composition is less than 500 Pa·s, a temperature which gives the minimum melt viscosity is less than 200° C., and, a melt viscosity at 200° C. of the composition is 500 Pa·s or more:
    (A) a polymer having a reactive functional group
    (B) a thermosetting resin
    (C) a compound having flux activity.

2. The adhesive composition according to claim 1, wherein (A) the polymer having a reactive functional group is a silicone resin.

3. The adhesive composition according to claim 1, wherein the reactive functional group is at least one selected from a hydroxyl group and an epoxy group.

4. The adhesive composition according to claim 2, wherein the reactive functional group is at least one selected from a hydroxyl group and an epoxy group.

5. The adhesive composition according to claim 1, wherein (B) the thermosetting resin is an epoxy resin.

6. The adhesive composition according to claim 2, wherein (B) the thermosetting resin is an epoxy resin.

7. The adhesive composition according to claim 3, wherein (B) the thermosetting resin is an epoxy resin.

8. The adhesive composition according to claim 4, wherein (B) the thermosetting resin is an epoxy resin.

9. The adhesive composition according to claim 5, wherein the composition further comprises at least one of an epoxy resin-hardener and an epoxy resin-hardening accelerator.

10. The adhesive composition according to claim 6, wherein the composition further comprises at least one of an epoxy resin-hardener and an epoxy resin-hardening accelerator.

11. The adhesive composition according to claim 7, wherein the composition further comprises at least one of an epoxy resin-hardener and an epoxy resin-hardening accelerator.

12. The adhesive composition according to claim 8, wherein the composition further comprises at least one of an epoxy resin-hardener and an epoxy resin-hardening accelerator.

13. The adhesive composition according to claim 1, wherein (C) the compound having flux activity is a compound having a carboxyl group or a phenolic hydroxyl group.

14. An adhesive sheet comprising an adhesive layer formed by the application of the adhesive composition according to claim 1.

15. A semiconductor apparatus protective material having an adhesive layer formed by the application of the adhesive composition according to claim 1.

16. A semiconductor apparatus having a cured product of the adhesive composition according to claim 1.

* * * * *